US005503956A

United States Patent [19]

Kaszczuk et al.

[11] Patent Number: 5,503,956

[45] Date of Patent: Apr. 2, 1996

[54] MIXTURE OF DYES FOR BLACK LASER ABLATIVE RECORDING ELEMENT

[75] Inventors: Linda Kaszczuk, Webster; Steven Evans; Richard W. Topel, Jr., both of Rochester, all of N.Y.

[73] Assignee: Eastman Kodak Company, Rochester, N.Y.

[21] Appl. No.: 99,971

[22] Filed: Jul. 30, 1993

[51] Int. Cl.[6] .............................. G03C 5/16; G03F 7/26; B41M 5/38

[52] U.S. Cl. ........................ 430/200; 430/201; 430/270.1; 430/269; 430/945; 503/227; 428/914; 8/471

[58] Field of Search .................................... 430/200, 270, 430/201, 269, 945, 944, 964; 503/227; 428/914; 8/471; 346/766, 135.1

[56] References Cited

U.S. PATENT DOCUMENTS

| | | | |
|---|---|---|---|
| 4,245,003 | 1/1981 | Oransky et al. | 428/323 |
| 4,816,435 | 3/1989 | Murata et al. | 428/913 |
| 4,833,124 | 5/1989 | Lum | 503/227 |
| 4,839,336 | 6/1989 | Evans et al. | 428/914 |
| 4,912,084 | 3/1990 | Kanto et al. | 503/227 |
| 4,973,572 | 11/1990 | DeBoer | 430/201 |
| 5,009,987 | 4/1991 | Mihara et al. | 430/945 |
| 5,126,311 | 6/1992 | Evans et al. | 428/914 |
| 5,126,314 | 6/1992 | Evans et al. | 428/914 |
| 5,134,116 | 7/1992 | Chapman et al. | 428/914 |
| 5,156,938 | 10/1992 | Foley et al. | 430/200 |
| 5,168,093 | 12/1992 | Takuma et al. | 503/227 |
| 5,169,828 | 12/1992 | Janssens et al. | 428/914 |
| 5,264,320 | 11/1993 | Evans et al. | 430/201 |
| 5,330,876 | 7/1994 | Kaszczuk et al. | 430/945 |
| 5,401,618 | 3/1995 | Chapman et al. | 430/945 |

FOREIGN PATENT DOCUMENTS

| | | | |
|---|---|---|---|
| 0522207 | 1/1993 | European Pat. Off. | 503/227 |

*Primary Examiner*—Charles L. Bowers, Jr.
*Assistant Examiner*—Martin J. Angebranndt
*Attorney, Agent, or Firm*—Harold E. Cole

[57] ABSTRACT

A black laser dye-ablative recording element comprising a support having thereon a dye layer comprising a mixture of at least one cyan, magenta and yellow dye dispersed in a polymeric binder, said dye layer having an infrared-absorbing material associated therewith, said cyan dye having the formula:

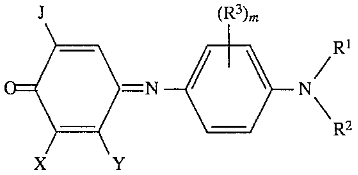

I wherein:

$R^1$, $R^2$, $R^3$, X, Y, J and m are as defined.

7 Claims, No Drawings

MIXTURE OF DYES FOR BLACK LASER ABLATIVE RECORDING ELEMENT

This invention relates to use of a mixture of cyan, yellow and magenta dyes in a black laser dye-ablative recording element.

In recent years, thermal transfer systems have been developed to obtain prints from pictures which have been generated electronically from a color video camera. According to one way of obtaining such prints, an electronic picture is first subjected to color separation by color filters. The respective color-separated images are then converted into electrical signals. These signals are then operated on to produce cyan, magenta and yellow electrical signals. These signals are then transmitted to a thermal printer. To obtain the print, a cyan, magenta or yellow dye-donor element is placed face-to-face with a dye-receiving element. The two are then inserted between a thermal printing head and a platen roller. A line-type thermal printing head is used to apply heat from the back of the dye-donor sheet. The thermal printing head has many heating elements and is heated up sequentially in response to the cyan, magenta and yellow signals. The process is then repeated for the other two colors. A color hard copy is thus obtained which corresponds to the original picture viewed on a screen. Further details of this process and an apparatus for carrying it out are contained in U.S. Pat. No. 4,621,271, the disclosure of which is hereby incorporated by reference.

Another way to thermally obtain a print using the electronic signals described above is to use a laser instead of a thermal printing head. In such a system, the donor sheet includes a material which strongly absorbs at the wavelength of the laser. When the donor is irradiated, this absorbing material converts light energy to thermal energy and transfers the heat to the dye in the immediate vicinity, thereby heating the dye to its vaporization temperature for transfer to the receiver. The absorbing material may be present in a layer beneath the dye and/or it may be admixed with the dye. The laser beam is modulated by electronic signals which are representative of the shape and color of the original image, so that each dye is heated to cause volatilization only in those areas in which its presence is required on the receiver to reconstruct the color of the original object. Further details of this process are found in GB 2,083,726A, the disclosure of which is hereby incorporated by reference.

In one ablative mode of imaging by the action of a laser beam, an element with a dye layer composition comprising an image dye, an infrared-absorbing material, and a binder coated onto a substrate is imaged from the dye side. The energy provided by the laser drives off the image dye at the spot where the laser beam hits the element and leaves the binder behind. In ablative imaging, the laser radiation causes rapid local changes in the imaging layer thereby causing the material to be ejected from the layer. This is distinguishable from other material transfer techniques in that some sort of chemical change (e.g., bond-breaking), rather than a completely physical change (e.g., melting, evaporation or sublimation), causes an almost complete transfer of the image dye rather than a partial transfer. The transmission D-min density value serves as a measure of the completeness of image dye removal by the laser.

U.S. Pat. No. 4,973,572 relates to infrared-absorbing cyanine dyes used in laser-induced thermal dye transfer elements. In Example 3 of that patent, a positive image is obtained in the dye element by using an air stream to remove sublimed dye. However, there is no disclosure in that patent of a black laser ablative recording element as disclosed in this invention.

U.S. Pat. No. 4,245,003 relates to a laser-imageable element comprising graphite particles in a binder. As will be shown by comparative tests hereafter, the black dye combination of the invention provides improved D-min's over that obtained using graphite.

U.S. Pat. No. 5,156,938 relates to the use of a mixture of various dyes to obtain a neutral or black image. As will be shown by comparative tests hereafter, the black dye combination of the invention provides improved D-min over the black dye combination of this patent.

It is an object of this invention to provide a black laser dye-ablative recording element having an improved D-min. It is another object of this invention to provide a single-sheet process which does not require a separate receiving element.

These and other objects are achieved in accordance with the invention which comprises a black laser dye-ablative recording element comprising a support having thereon a dye layer comprising a mixture of at least one cyan, magenta and yellow dye dispersed in a polymeric binder, said dye layer having an infrared-absorbing material associated therewith, and said cyan dye having the formula:

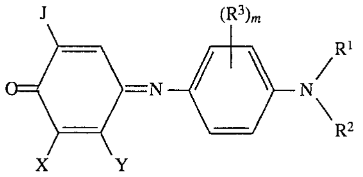

I wherein:

- $R^1$ and $R^2$ each independently represents hydrogen; an alkyl group having from 1 to about 6 carbon atoms; a cycloalkyl group having from about 5 to about 7 carbon atoms; allyl; or such alkyl, cycloalkyl or allyl groups substituted with one or more groups such as alkyl, aryl, alkoxy, aryloxy, amino, halogen, nitro, cyano, thiocyano, hydroxy, acyloxy, acyl, alkoxycarbonyl, aminocarbonyl, alkoxycarbonyloxy, carbamoyloxy, acylamido, ureido, imido, alkylsulfonyl, arylsulfonyl, alkylsulfonamido, arylsulfonamido, alkylthio, arylthio, trifluoromethyl, etc., e.g., methyl, ethyl, propyl, isopropyl, butyl, pentyl, hexyl, methoxyethyl, benzyl, 2-methanesulfonamidoethyl, 2-hydroxyethyl, 2-cyanoethyl, methoxycarbonylmethyl, cyclohexyl, cyclopentyl, phenyl, pyridyl, naphthyl, thienyl, pyrazolyl, p-tolyl, p-chlorophenyl, m-(N-methyl-sulfamoyl) phenylmethyl, methylthio, butylthio, benzylthio, methanesulfonyl, pentanesulfonyl, methoxy, ethoxy, 2-methane-sulfonamidoethyl, 2-hydroxyethyl, 2-cyanoethyl, methoxycarbonylmethyl, imidazolyl, naphthyloxy, furyl, p-tolylsulfonyl, p-chlorophenylthio, m-(N-methyl sulfamoyl) phenoxy, ethoxycarbonyl, methoxyethoxycarbonyl, phenoxycarbonyl, acetyl, benzoyl, N, N-dimethylcarbamoyl, dimethylamino, morpholino, anilino, pyrrolidino etc.;
- or $R^1$ and $R^2$ can be joined together to form, along with the nitrogen to which they are attached, a 5- to 7-membered heterocyclic ring such as morpholine or pyrrolidine;
- or either or both of $R^1$ and $R^2$ can be combined with $R^3$ to form a 5- to 7-membered heterocyclic ring;
- each $R^3$ independently represents substituted or unsubstituted alkyl, cycloalkyl or allyl as described above for $R^1$ and $R^2$, alkoxy, aryloxy, halogen, thiocyano, acylamido, ureido, alkylsulfonamido, arylsulfonamido, alkylthio, arylthio or trifluoromethyl;
- or any two of $R^3$ may be combined together to form a 5- or 6-membered carbocyclic or heterocyclic ring;

or one or two of $R^3$ may be combined with either or both of $R^1$ and $R^2$ to complete a 5-to 7-membered ring;

X represents hydrogen, halogen or may be combined together with Y to represent the atoms necessary to complete a 6-membered aromatic ring, thus forming a fused bicyclic quinoneimine, such as a naphthoquinoneimine; with the proviso that when X is hydrogen, then J represents $NHCOR_F$, where $R_F$ represents a perfluorinated alkyl or aryl group; and with the further proviso that when X is halogen, then J represents $NHCOR^4$, $NHCO_2R^4$, $NHCONHR^4$ or $NHSO_2R^4$; and with the further proviso that when X is combined with Y, then J represents $CONHR^4$, $SO_2NHR^4$, CN, $SO_2R^4$ or SCN, in which case, however, $R^4$ cannot be hydrogen;

$R^4$ is the same as $R^1$ as described above or a substituted or unsubstituted aryl group of from about 6 to about 10 carbon atoms, such as phenyl, naphthyl, p-tolyl, m-chlorophenyl, p-methoxyphenyl, m-bromophenyl, o-tolyl, etc.;

m is an integer of from 0 to 4; and

Y is the same as $R^1$ as described above, a substituted or unsubstituted aryl group of from about 6 to about 10 carbon atoms, such as those described above for $R^4$, acylamino, or may be combined together with X as described above.

Cyan dyes included within the scope of the above formula I are described in U.S. Pat. No. 5,024,490, the disclosure of which is hereby incorporated by reference. Preferred cyan dyes include the following:

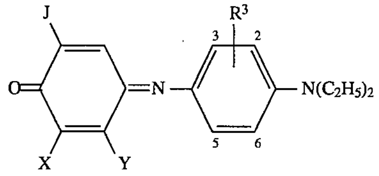

| Compd. | $R^3$ | Y | X | J |
|---|---|---|---|---|
| A | 3-$CH_3$ | $C_2H_5$ | Cl | $NHCOCH_2OCH_3$ |
| B | 3-$CH_3$ | $NHCOCH_2OCH_3$ | H | $NHCOC_3F_7$ |
| C | H | $-(CH=CH)_2-$ | | $CONHCH_3$ |
| D | 3-$CH_3$ | $-(CH=CH)_2-$ | | $CONHCH_3$ |
| E | 3-$OCH_3$ | $C_2H_5$ | Cl | $NHCONHC_2H_5$ |
| F | 2-$OCH_3$ 5-$CH_3$ | $CH_3$ | Cl | $NHCOC_6H_5$ |
| G | 3-$OC_2H_5$ | $C_3H_7$ | Cl | $NHSO_2C_6H_5$ |
| H | H | $-(CH=CH)_2-$ | | CN |
| I | H | $-(CH=CH)_2-$ | | $SO_2C_4H_9$-n |
| J | 3-$CH_3$ | $-(CH=CH)_2-$ | | $CONHC_2H_4Cl$ |
| K | 3-$C_2H_5$ | $-(CH=CH)_2-$ | | $SO_2NHCH_3$ |
| L | H | H | H | $NHCOC_3F_7$ |
| M | 2-$OCH_3$ | $C_6H_5$ | H | $NHCOC_3F_7$ |
| N | 3-$CH_3$ | $C_2H_4OCH_3$ | Cl | $NHCOC_2H_5$ |

O

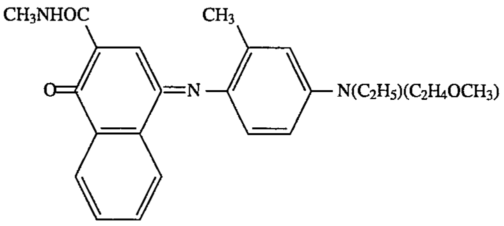

P

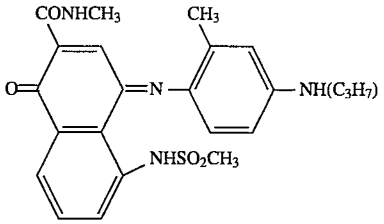

-continued

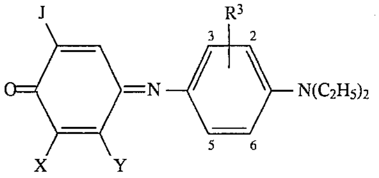

| Compd. | $R^3$ | Y | X | J |
|---|---|---|---|---|
| Q | 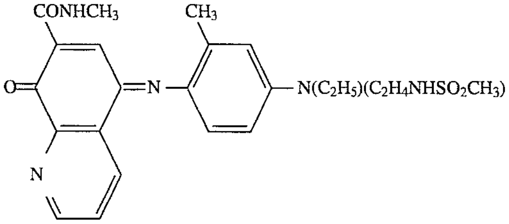 | | | |

It has been found that use of the particular cyan dye described above in combination with a yellow and a magenta dye to make a black ablative element provides an improved D-min in comparison to other prior art dye combinations.

In a preferred embodiment of the invention, the magenta dye employed has the following formula:

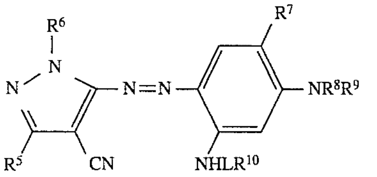

II wherein:

$R^5$ is hydrogen, a substituted or unsubstituted alkyl group of from 1 to about 6 carbon atoms such as those described above for $R^1$, or a substituted or unsubstituted aryl group of from about 6 to about 10 carbon atoms, such as those described above for $R^4$;

$R^6$ is a substituted or unsubstituted alkyl or allyl group of from 1 to about 6 carbon atoms, such as those described above for $R^1$; or a substituted or unsubstituted aryl group of from about 6 to about 10 carbon atoms such as those described above for $R^4$;

$R^7$ is an alkoxy group of from 1 to about 4 carbon atoms or represents the atoms which when taken together with $R^9$ forms a 5- or 6-membered ring;

$R^8$ is a substituted or unsubstituted alkyl or allyl group of from 1 to about 6 carbon atoms, such as those described above for $R^1$;

$R^9$ is any of the groups for $R^8$ or represents the atoms which when taken together with $R^7$ forms a 5- or 6-membered ring;

$R^{10}$ is a substituted or unsubstituted alkyl group of from 1 to about 6 carbon atoms such as those listed above for $R^1$, or a substituted or unsubstituted aryl group of from about 6 to about 10 carbon atoms such as those described above for $R^4$; and L is CO, $CO_2$, $-SO_2-$ or $CONR^5-$.

The compounds of the formula II above employed in the invention may be prepared by any of the processes disclosed in U.S. Pat. No. 3,336,285, Br 1,566,985, DE 2,600,036 and Dyes and Pigments, Vol 3, 81 (1982), the disclosures of which are hereby incorporated by reference.

Magenta dyes included within the scope of the above formula II include the following:

II

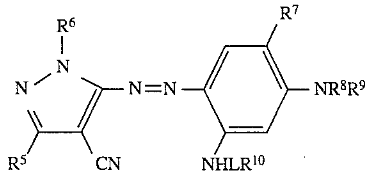

| Dye | $R^8$ | $R^9$ | $R^{10}$ | $R^6$ | $R^5$ | $R^7$ | L |
|---|---|---|---|---|---|---|---|
| 1 | $C_2H_5$ | $C_2H_5$ | $CH_3$ | $CH_3$ | $C_4H_9$-t | $OCH_3$ | CO |
| 2 | $C_2H_5$ | $C_2H_5$ | $CH_3$ | $CH_2CH-OHCH_3$ | $C_4H_9$-t | $OCH_3$ | CO |
| 3 | $C_3H_7$ | $C_3H_7$ | $CH_3$ | $CH_3$ | $C_4H_9$-t | $OCH_3$ | CO |
| 4 | $C_2H_5$ | $C_2H_5$ | $C_4H_9$-t | $CH_3$ | $CH_3$ | $OCH_3$ | CO |
| 5 | $C_2H_5$ | $C_2H_5$ | $CH_3$ | $C_2H_5$ | $C_4H_9$-t | $OC_2H_5$ | $SO_2$ |
| 6 | $C_2H_5$ | $C_2H_5$ | $C_2H_5$ | $CH_3$ | $CH_3$ | $OC_2H_5$ | CO |
| 7 | $C_2H_5$ | $C_3H_7$ | $CH_3$ | $CH_3$ | $C_4H_9$-t | $OCH_3$ | CO |
| 8 | $C_2H_5$ | $C_2H_5$ | $CH_3$ | $CH_3$ | $C_4H_9$-t | $OCH_3$ | $CO_2$ |
| 9 | $C_2H_5$ | $C_2H_5$ | $C_6H_5$ | $C_3H_7$ | $C_4H_9$-t | $OC_2H_5$ | $SO_2$ |
| 10 | $CH_2=CH-CH_2$ | $CH_2=CH-CH_2$ | $CH_3$ | $CH_2C_6H_5$ | $C_4H_9$-t | $OCH_3$ | CO |
| 11 | $C_3H_7$ | $C_3H_7$ | $C_2H_5$ | $C_2H_5$ | $CH_3$ | $OC_3H_7$ | CO |

-continued

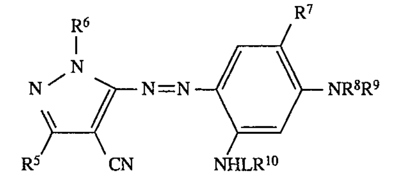

II

| Dye | $R^8$ | $R^9$ | $R^{10}$ | $R^6$ | $R^5$ | $R^7$ | L |
|---|---|---|---|---|---|---|---|
| 12 | $C_3H_7$ | $C_3H_7$ | $C_2H_5$ | $C_2H_5$ | $CH_3$ | $OC_3H_7$ | $SO_2$ |
| 13 | 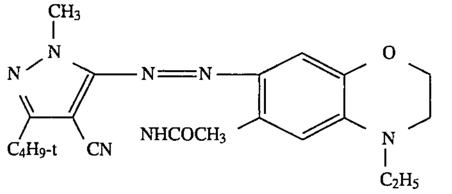 | | | | | | |
| 14 | 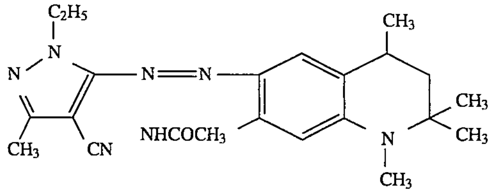 | | | | | | |

In another preferred embodiment of the invention, the magenta dye has the formula:

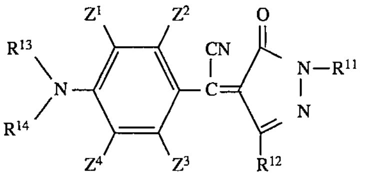

III wherein:

$R^{11}$ represents a substituted or unsubstituted alkyl group having from 1 to 10 carbon atoms, such as those described above for $R^1$; a cycloalkyl group having from 5 to 7 carbon atoms, such as those described above for $R^1$; or an aryl or pyridinyl group having from 6 to 10 carbon atoms, such as those described above for $R^4$;

$R^{12}$ represents a substituted or unsubstituted alkoxy group having from 1 to 10 carbon atoms; a substituted or unsubstituted aryloxy group having from 6 to 10 carbon atoms; $NHR^{15}$; or $NR^{15}R^{16}$;

$R^{13}$ and $R^{14}$ each represents $R^{11}$; or $R^{13}$ can be joined to $Z^1$ to form a 5- or 6-membered ring and/or $R^{14}$ can be joined to $Z^4$ to form a 5- or 6-membered ring; or $R^{13}$ and $R^{14}$ can be joined together to form, along with the nitrogen to which they are attached, a 5- or 6-membered heterocyclic ring;

$R^{15}$ and $R^{16}$ each independently represents a substituted or unsubstituted alkyl group having from 1 to 10 carbon atoms, such as those described above for $R^1$; a cycloalkyl group having from 5 to 7 carbon atoms, such as those described above for $R^1$, or an aryl group having from 6 to 10 carbon atoms, such as those described above for $R^4$; or $R^{15}$ and $R^{16}$ may be joined together to form, along with the nitrogen to which they are attached, a 5- or 6-membered heterocyclic ring; and $Z^1$, $Z^2$, $Z^3$ and $Z^4$ each represents hydrogen, an alkyl group, an alkoxy group or halogen; or $Z^1$ and $Z^2$ can be joined together to form, along with the carbon atoms to which they are attached, a 5- or 6-membered ring.

Magenta dyes included within the scope of Formula III above are disclosed in U.S. Pat. No. 4,839,336, the disclosure of which is hereby incorporated by reference. A preferred compound has the following structure:

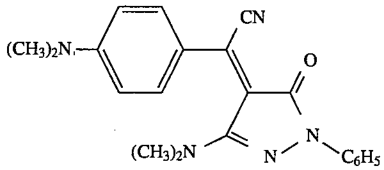

III-1

Any yellow dye may be employed in the invention. For example, there may be employed dicyanovinylaniline dyes as disclosed in U.S. Pat. Nos. 4,701,439 and 4,833,123 and JP 60/28,451, the disclosures of which are hereby incorporated by reference, e.g.,

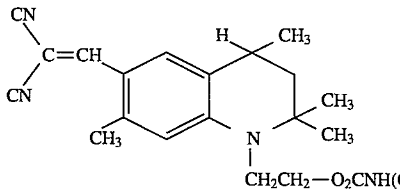

A merocyanine dyes as disclosed in U.S. Pat. Nos. 4,743,582 and 4,757,046, the disclosures of which are hereby incorporated by reference, e.g.,

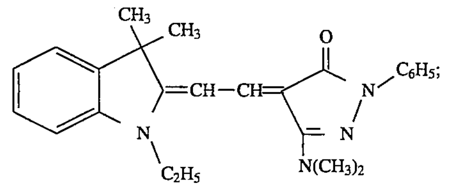

B pyrazolone arylidene dyes as disclosed in U.S. Pat. No.

4,866,029, the disclosure of which is hereby incorporated by reference; e.g.,

C

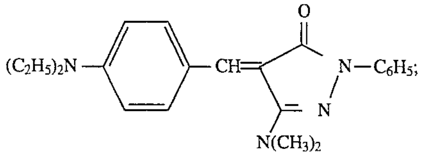

azophenol dyes as disclosed in JP 60/30,393, the disclosure of which is hereby incorporated by reference; e.g.,

D

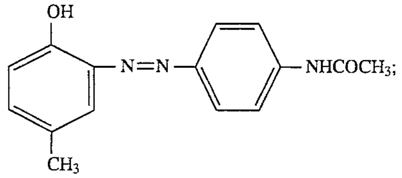

Disperse Yellow 3 azopyrazolone dyes as disclosed in JP 63/182,190 and JP 182,191, the disclosures of which are hereby incorporated by reference, e.g.,

E

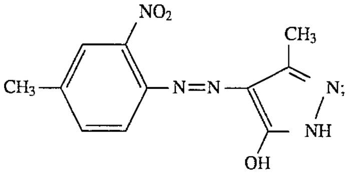

F

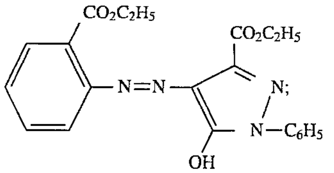

pyrazolinedione arylidene dyes as disclosed in U.S. Pat. No. 4,853,366, the disclosure of which is hereby incorporated by reference, e.g.,

G

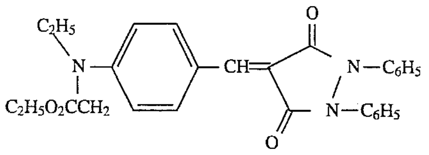

azopyridone dyes as disclosed in JP 63/39,380, the disclosure of which is hereby incorporated by reference, e.g.,

H

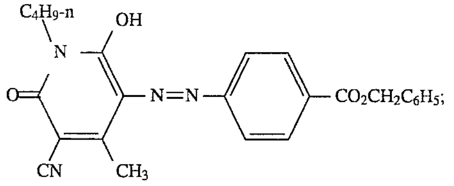

quinophthalone dyes as disclosed in EP 318,032, the disclosure of which is hereby incorporated by reference, e.g.,

I

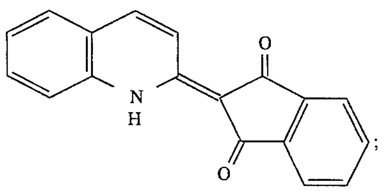

azodiaminopyridine dyes as disclosed in EP 346,729, U.S.

Pat. No. 4,914,077 and DE 3,820,313, the disclosures of which are hereby incorporated by reference, e.g.,

J

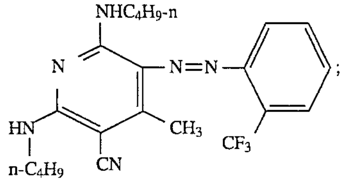

thiadiazoleazo dyes and related dyes as disclosed in EP 331,170, JP 01/225,592 and U.S. Pat. No. 4,885,272, the disclosures of which are hereby incorporated by reference, e.g.,

K

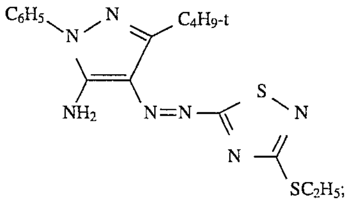

L

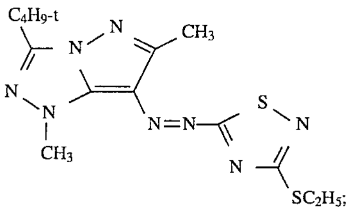

azamethine dyes as disclosed in JP 01/176,591, EPA 279, 467, JP 01/176,590, and JP 01/178,579, the disclosures of which are hereby incorporated by reference, e.g.,

M

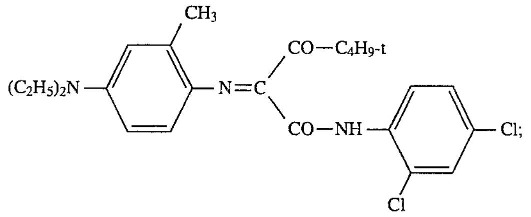

nitrophenylazoaniline dyes as disclosed in JP 60/31,565, the disclosure of which is hereby incorporated by reference, e.g.,

N

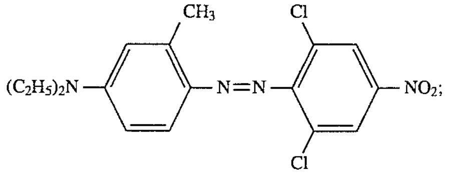

pyrazolonethiazole dyes as disclosed in U.S. Pat. No. 4,891, 353, the disclosure of which is hereby incorporated by reference; arylidene dyes as disclosed in U.S. Pat. No. 4,891,354, the disclosure of which is hereby incorporated by reference; and dicyanovinylthiazole dyes as disclosed in U.S. Pat. No. 4,760,049, the disclosure of which is hereby incorporated by reference.

In a preferred embodiment of the invention, the yellow dye employed has the formula:

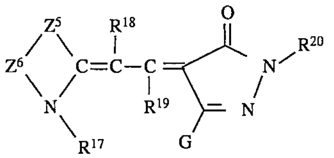

IV wherein:

$R^{17}$ represents a substituted or unsubstituted alkyl group of from 1 to about 10 carbon atoms, such as those described above for $R^1$; a cycloalkyl group of from about 5 to about 7 carbon atoms, such as those described above for $R^1$; a substituted or unsubstituted allyl group, such as those described above for $R^1$; a substituted or unsubstituted aryl group of from about 6 to about 10 carbon atoms, such as those described above for $R^4$; a hetaryl group of from about 5 to about 10 atoms, such as 1-pyrazolyl, 2-thienyl, etc.; or such aryl and hetaryl groups substituted with groups as described above; acyloxy such as acetoxy, benzoyloxy, etc.; alkoxy such as methoxy, 2-methoxyethoxy, etc.; aryloxy such as phenoxy, 3-chlorophenoxy, etc.; cyano; acylamino such as acetamido, benzamido, etc.; carbamoyloxy such as N-phenylcarbamoyloxy, N-N-diethylcarbamoyloxy, etc.; ureido; imido; alkoxycarbonyl such as methoxycarbonyl, ethoxycarbonyl, etc.; acyl such as benzoyl, formyl, acetyl, etc.; alkylsulfonyl such as butanesulfonyl, methanesulfonyl, etc.; arylsulfonyl such as benzenesulfonyl, p-toluenesulfonyl, etc.; aminocarbonyl such as N,N-dimethylcarbamoyl, N-ethylcarbamoyl, etc.; aminosulfonyl such as N-phenylsulfamoyl, N-methylsulfamoyl, etc.; fluorosulfonyl; halogen, such as chlorine, bromine or fluorine; nitro; alkylthio such as methylthio, benzylthio, etc.; or arylthio such as phenylthio, 2-benzoxazolethio, etc.

$R^{18}$ and $R^{19}$ each independently represents hydrogen; $R^{17}$; cyano; acyloxy such as acetoxy, phenacyloxy, etc.; alkoxy of 1 to about 6 carbon atoms such as ethoxy, i-propoxy, etc.; halogen such as fluorine, chlorine or bromine; or alkoxycarbonyl such as methoxycarbonyl, butoxycarbonyl, etc.;

or any two of $R^{17}$, $R^{18}$ and $R^{19}$ together represent the atoms necessary to complete a 5- to 7-membered ring;

$R^{20}$ represents the same groups as $R^{17}$;

G represents a substituted or unsubstituted alkyl, cycloalkyl or allyl group as described above for $R^{17}$, $NR^{21}R^{22}$ or $OR^{23}$;

$R^{21}$ and $R^{22}$ each independently represents hydrogen, acyl or $R^{17}$, with the proviso that $R^{21}$ and $R^{22}$ cannot both be hydrogen at the same time;

or $R^{21}$ and $R^{22}$ together represent the atoms necessary to complete a 5- to 7-membered ring;

$R^{23}$ represents the same groups as $R^{17}$; $Z^5$ represents $C(R^{24})(R^{25})$, S, O or $NR^{24}$; $R^{24}$ and $R^{25}$ each independently represents the same groups as $R^{17}$;

or $R^{24}$ and $R^{25}$ together represent the atoms necessary to complete a 5- to 7-membered ring; and $Z^6$ represents the atoms necessary to complete a 5- or 6-membered ring which may be fused to another ring system. Compounds included within the scope of formula IV above include the following:

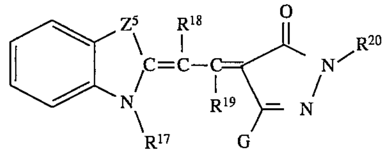

| Cmpd | $Z^5$ | G | $R^{17}$ | $R^{18}$ | $R^{19}$ | $R^{20}$ |
|---|---|---|---|---|---|---|
| 1 | $C(CH_3)_2$ | $N(CH_3)_2$ | $C_2H_5$ | H | H | $C_6H_5$ |
| 2 | $C(CH_3)_2$ | $CH_3$ | $CH_3$ | H | H | $C_6H_5$ |
| 3 | S | $CH_3$ | $CH_3$ | H | H | $C_6H_5$ |
| 4 | S | $N(CH_3)_2$ | $C_2H_5$ | H | H | $C_2H_5$ |
| 5 | O | $CH_3$ | $CH_3$ | H | H | $C_6H_5$ |
| 6 | $C(CH_3)_3$ | $NHCOCH_3$ | $CH_3$ | H | H | $C_6H_5$ |
| 7 | $C(CH_3)_2$ | $OC_2H_5$ | $C_3H_7$ | H | H | $C_6H_4$-4 $CO_2CH_3$ |
| 8 | $C(CH_3)_2$ | $N(CH_3)_2$ | $C_2H_4-Cl$ | H | $CH_3$ | $C_6H_5$ |
| 9 | O | $OC_2H_5$ | $CH_3$ | H | H | $C_6H_5$ |
| 10 | S | $NHCOCH_3$ | $CH_3$ | $OCH_3$ | H | $CH_3$ |
| 11 | $C(CH_3)_2$ | $N(CH_3)_2$ | $CH_3$ | $CH_3$ | H | $C_6H_5$ |
| 12 | $C(CH_3)_2$ | $OCH_3$ | $CH_3$ | $CH_3$ | H | $C_6H_5$ |
| 13 | $C(CH_3)_2$ | $NHCOCH_3$ | $CH_3$ | $CH_3$ | H | $C_6H_5$ |
| 14 | $C(CH_3)_2$ | $N(CH_3)_2$ | $C_2H_5$ | $CH_3$ | H | $C_6H_5$ |
| 15 | $C(CH_3)_2$ | $OC_3H_7$-i | $C_2H_5$ | $CH_3$ | H | $C_6H_4$-3Cl |
| 16 | $C(CH_3)_2$ | $NHCOCH_3$ | $C_2H_5$ | $CH_3$ | H | $C_6H_5$ |
| 17 | $C(CH_3)_2$ | $N(CH_3)_2$ | $CH_3$ | $CO_2CH_3$ | H | $C_2H_5$ |
| 18 | $C(CH_3)_2$ | $N(CH_3)_2$ | $CH_2CH_2OH$ | H | H | $C_6H_5$ |
| 19 | $NCH_3$ | $N(CH_3)_2$ | $CH_3$ | H | $OCH_3$ | $CH_2CH_2OH$ |
| 20 | $C(CH_3)_2$ | $N(CH_3)_2$ | $CH_2CONHCH_3$ | H | H | $C_6H_5$ |

In another preferred embodiment of the invention, the yellow dye employed has the formula:

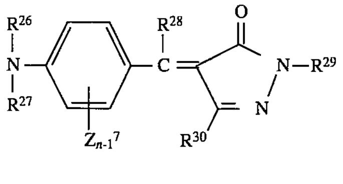

V wherein:

$R^{26}$ and $R^{27}$ each represents a substituted or unsubstituted alkyl group of from 1 to about 10 carbon atoms, such as those described above for $R^1$; a cycloalkyl group of from about 5 to about 7 carbon atoms, such as those described above for $R^1$; a substituted or unsubstituted allyl group, such as those described above for $R^1$; or an aryl group having from about 6 to about 10 carbon atoms, such as those described above for $R^4$;

or $R^{26}$ and $R^{27}$ can be joined together to form, along with the nitrogen to which they are attached, a 5-or 6-membered heterocyclic ring, such as a pyrrolidine or morpholine ring;

or either or both of $R^{26}$ and $R^{27}$ can be joined to the carbon atom of the benzene ring at a position ortho to the position of attachment of the anilino nitrogen to form a 5- or 6-membered ring, thus forming a polycyclic system such as 1,2,3,4-tetrahydroquinoline, julolidine, 2,3-dihydroindole, or benzomorpholine;

$R^{28}$ represents hydrogen; $R^1$; carbamoyl, such as N,N-dimethylcarbamoyl; or alkoxycarbonyl, such as ethoxycarbonyl or methoxyethoxy-carbonyl;

$R^{29}$ represents the same as $R^{26}$;

$R^{30}$ represents a substituted or unsubstituted alkoxy group having from 1 to about 10 carbon atoms; a substituted or unsubstituted aryloxy group having from about 6 to about 10 carbon atoms; $NHR^{31}$; $NR^{31}R^{32}$ or the atoms necessary to complete a 6-membered ring fused to the benzene ring;

$R^{31}$ and $R^{32}$ each independently represents any of the groups for $R^{29}$; or $R^{31}$ and $R^{32}$ may be joined together to form, along with the nitrogen to which they are attached, a 5-or 6-membered heterocyclic ring;

n is a positive integer from 1 to 3; and $Z^7$ represents a substituted or unsubstituted alkyl or alkoxy group of from 1 to about 10 carbon atoms; halogen; aryloxy; or represents the atoms necessary to complete a 5- or 6-membered ring, thus forming a fused ring system such as naphthalene, quinoline, isoquinoline or benzothiazole. Compounds included within the scope of formula V above include the following:

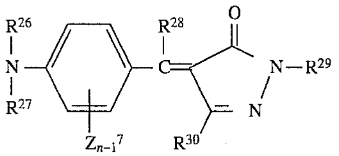

V

| Cmpd. | $Z^7$* | $R^{26}$ | $R^{27}$ | $R^{28}$ | $R^{29}$ | $R^{30}$ |
|---|---|---|---|---|---|---|
| 1 | H | $C_2H_5$ | $C_2H_5$ | H | $C_6H_5$ | $N(CH_3)_2$ |
| 2 | H | $CH_3$ | $CH_3$ | H | $C_6H_5$ | $N(CH_3)_2$ |
| 3 | H | n-$C_4H_9$ | n-$C_4H_9$ | H | $C_6H_5$ | $N(CH_3)_2$ |
| 4 | 3-$CH_3$ | $C_2H_5$ | $CF_3CH_2O_2CCH_2$ | H | $C_6H_5$ | $N(CH_3)_2$ |
| 5 | H | 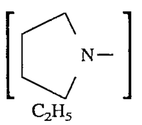 | | H | $C_6H_5$ | $N(CH_3)_2$ |
| 6 | H | $C_2H_5$ | $C_2H_5$ | H | $C_6H_5$ | $NHC_6H_5$ |
| 7 | H | $C_2H_5$ | $C_2H_5$ | H | $C_6H_5$ | 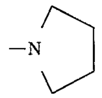 |
| 8 | H | $C_2H_5$ | $C_2H_5$ | H | $C_6H_5$ | 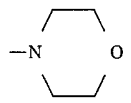 |
| 9 | H | $C_2H_5$ | $C_2H_5$ | H | $C_6H_5$ | $NHCH_3$ |
| 10 | H | $C_2H_5$ | $C_2H_5$ | H | $C_6H_5$ | $N(C_2H_5)-(C_6H_5)$ |
| 11 | 3-$OCH_3$ | $C_2H_5$ | $C_2H_5$ | H | $C_6H_5$ | $N(CH_3)_2$ |
| 12 | H | n-$C_4H_9$ | n-$C_4H_9$ | H | $C_6H_5$ | $OC_2H_5$ |
| 13 | 3-Cl | $CH_3$ | $C_2H_5O_2CCH_2$ | H | $C_{10}H_9$ | $N(CH_3)_2$ |
| 14 | H | 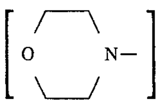 | | H | 4-Cl$-C_6H_4$ | $OCH_3$ |
| 15 | 3-$CH_3$ | $ClC_2H_4$ | $ClC_2H_4$ | H | $CH_2C_6H_5$ | $OC_6H_5$ |
| 16 | 3-$C_2H_5$ | $C_6H_5CH_2$ | $C_2H_5$ | H | $CH_3$ | $N(CH_3)_2$ |
| 17 | **2,5-$(OCH_3)_2$ | $CH_3$ | $CH_3$ | H | 3,5$(Cl)_2-C_6H_3$ | $NHCH_3$ |
| 18 | H | $CH_3$ | $CH_3$ | $CO_2C_2H_5$ | $C_6H_5$ | $N(CH_3)_2$ |
| 19 | H | $CH_3$ | $CH_3$ | Cl | $C_6H_5$ | $N(CH_3)_2$ |
| 20 | 3-$CH_3$ | $C_2H_5$ | $C_6H_5CH_2$ | H | $C_6H_5$ | $OC_2H_5$ |
| 21 | H | $C_2H_5$ | $C_2H_5$ | H | $C_6H_5$ | $OC_3H_7$-i |

-continued
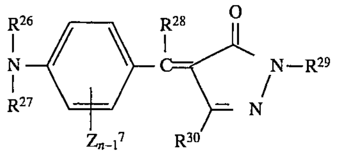
V
| Cmpd. | $Z^7$* | $R^{26}$ | $R^{27}$ | $R^{28}$ | $R^{29}$ | $R^{30}$ |
|---|---|---|---|---|---|---|
22
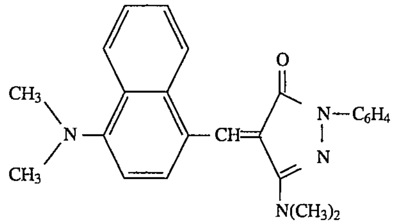
23
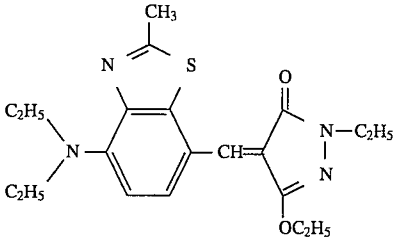
24
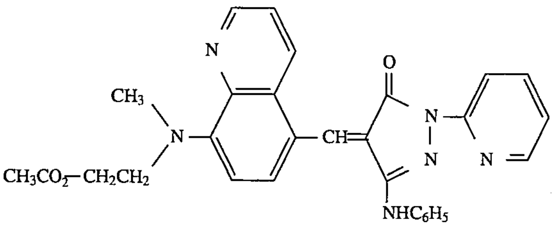
25
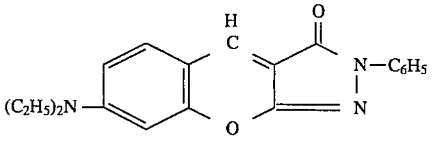
26
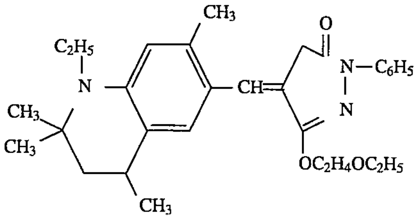
27
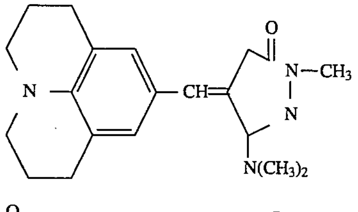
28
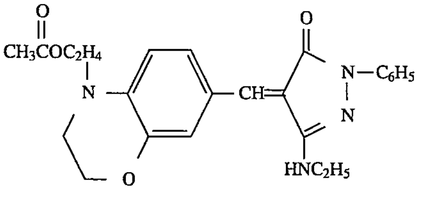

-continued

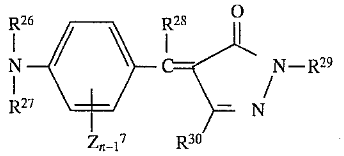

V

| Cmpd. | Z⁷* | $R^{26}$ | $R^{27}$ | $R^{28}$ | $R^{29}$ | $R^{30}$ |
|---|---|---|---|---|---|---|
| 29 | 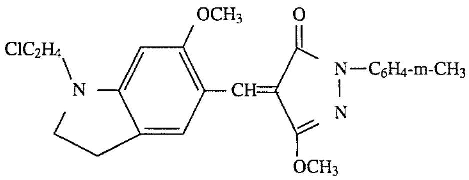 | | | | | |

*n = 2
**n = 3

The compounds of formula V employed in the invention above may be prepared by any of the processes disclosed in U.S. Pat. No. 4,866,029, the disclosure of which is hereby incorporated by reference.

In another preferred embodiment of the invention, the magenta dye has the formula:

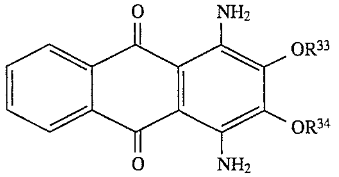

VI wherein $R^{33}$ and $R^{34}$ are each individually substituted or unsubstituted aryl as in $R^4$. A preferred example of this dye is:

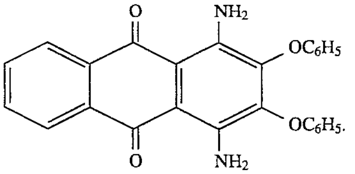

VI-1

In still another preferred embodiment of the invention, the magenta dye has the formula:

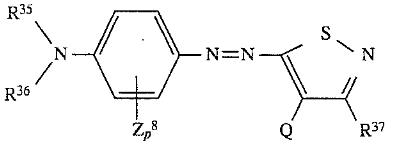

VII wherein:

$R^{35}$ and $R^{36}$ each independently represents hydrogen; a substituted or unsubstituted alkyl group of from 1 to about 10 carbon atoms, such as those listed above for $R^1$; a cycloalkyl group of from about 5 to about 7 carbon atoms, such as those listed above for $R^1$; an allyl group, such as those listed above for $R^1$; or a substituted or unsubstituted aryl group having from about 6 to about 10 carbon atoms, such as those listed above for $R^4$;

or $R^{35}$ and $R^{36}$ can be joined together to form, along with the nitrogen to which they are attached, a 5- or 6-membered heterocyclic ring, such as a pyrrolidine or morpholine ring;

or either or both of $R^{35}$ and $R^{36}$ can be joined to the carbon atom of the benzene ring at a position ortho to the position of attachment of the anilino nitrogen to form a 5- or 6-membered ring, thus forming a polycyclic system such as 1,2,3,4-tetrahydroquinoline, julolidine, 2,3-dihydroindole, or benzomorpholine;

$Z^8$ represents hydrogen, a substituted or unsubstituted alkyl group of from 1 to about 10 carbon atoms, such as those listed above for $R^1$; a substituted or unsubstituted aryl group of from about 6 to about 10 carbon atoms, such as those listed above for $R^4$; or NHA, where A is an acyl or sulfonyl radical such as formyl, lower alkanoyl, aroyl. cyclohexylcarbonyl, lower alkoxycarbonyl, aryloxycarbonyl, lower alkylsulfonyl, cyclohexylsulfonyl, arylsulfonyl, carbamoyl, lower alkylcarbamoyl, arylcarbamoyl, sulfamoyl, lower alkylsulfamoyl, furoyl, etc.;

Q represents cyano, thiocyanato, alkylthio or alkoxycarbonyl;

$R^{37}$ represents hydrogen; a substituted or unsubstituted alkyl group of from 1 to about 10 carbon atoms, such as those listed above for $R^1$; a substituted or unsubstituted aryl group of from about 6 to about 10 carbon atoms, such as those listed above for $R^4$; alkylthio or halogen; and p is a positive integer from 1 to 4. A preferred example of this dye is the following:

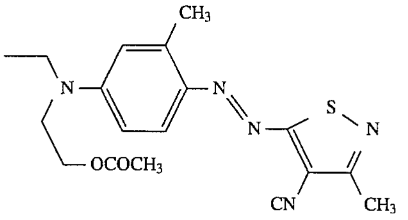

VII-1

The dye ablation elements of this invention can be used to obtain medical images, reprographic masks, printing masks, etc. The image obtained can be a positive or a negative image. The reduction in D-min obtained with this invention is important for graphic arts applications where the D-min/D-max of the mask controls the exposure latitude for subsequent use. This also improves the neutrality of the D-min for medical imaging applications. The dye removal process can be by either continuous (photographic-like) or halftone imaging methods.

Any polymeric material may be used as the binder in the recording element employed in the invention. For example, there may be used cellulosic derivatives, e.g., cellulose nitrate, cellulose acetate hydrogen phthalate, cellulose acetate, cellulose acetate propionate, cellulose acetate butyrate, cellulose triacetate, a hydroxypropyl cellulose ether, an ethyl cellulose ether, etc., polycarbonates; polyurethanes; polyesters; poly (vinyl acetate); polystyrene; poly-(styrene-co-acrylonitrile); a polysulfone; a poly(phenylene oxide); a poly(ethylene oxide); a poly(vinyl alcohol-co-acetal) such as poly(vinyl acetal), poly(vinyl alcohol-co-butyral) or poly(vinyl benzal); or mixtures or copolymers thereof. The binder may be used at a coverage of from about 0.1 to about 5 $g/m^2$.

In a preferred embodiment, the polymeric binder used in the recording element employed in process of the invention has a polystyrene equivalent molecular weight of at least 100,000 as measured by size exclusion chromatography, as described in U.S. Pat. No. 5,330,876.

A barrier layer may be employed in the laser ablative recording element of the invention if desired, as described in copending application Ser. No. 099,970 filed Jul. 30, 1993 entitled BARRIER LAYER FOR LASER ABLATIVE IMAGING, of Topel and Kaszczuk.

To obtain a laser-induced, dye ablative image according to the invention, a diode laser is preferably employed since it offers substantial advantages in terms of its small size, low cost, stability, reliability, ruggedness, and ease of modulation. In practice, before any laser can be used to heat a dye-ablative recording element, the element must contain an infrared-absorbing material, such as cyanine infrared-absorbing dyes as described in U.S. Pat. No. 5,401,618 or other materials as described in the following U.S. Pat. Nos.: 4,948,777, 4,950,640, 4,950,639, 4,948,776, 4,948,778, 4,942,141, 4,952,552, 5,036,040, and 4,912,083, the disclosures of which are hereby incorporated by reference. The laser radiation is then absorbed into the dye layer and converted to heat by a molecular process known as internal conversion. Thus, the construction of a useful dye layer will depend not only on the hue, transferability and intensity of the image dyes, but also on the ability of the dye layer to absorb the radiation and convert it to heat. The infrared-absorbing dye may be contained in the dye layer itself or in a separate layer associated therewith, i.e., above or below the dye layer. Preferably, the laser exposure in the process of the invention takes place through the dye side of the dye ablative recording element, which enables this process to be a single-sheet process, i.e., a separate receiving element is not required.

Lasers which can be used in the invention are available commercially. There can be employed, for example, Laser Model SDL-2420-H2 from Spectra Diode Labs, or Laser Model SLD 304 V/W from Sony Corp.

The above dyes in the recording element of the invention may be used at a coverage of from about 0.01 to about 1 $g/m^2$.

The dye layer of the dye-ablative recording element of the invention may be coated on the support or printed thereon by a printing technique such as a gravure process.

Any material can be used as the support for the dye-ablative recording element of the invention provided it is dimensionally stable and can withstand the heat of the laser. Such materials include polyesters such as poly(ethylene naphthalate); poly(ethylene terephthalate); polyamides; polycarbonates; cellulose esters such as cellulose acetate; fluorine polymers such as poly(vinylidene fluoride) or poly-(tetrafluoroethylene-co-hexafluoropropylene); polyethers such as polyoxymethylene; polyacetals; polyolefins such as polystyrene, polyethylene, polypropylene or methylpentene polymers; and polyimides such as polyimide-amides and polyether-imides. The support generally has a thickness of from about 5 to about 200 μm. In a preferred embodiment, the support is transparent.

The following examples are provided to illustrate the invention.

EXAMPLE 1

Preparation of Black Laser Ablative Recording Elements (BLARE)

BLARE 1 is a mixture of 826 sec. cellulose nitrate binder, cyan dye D, control dye 1, yellow dye V-1, magenta dye II-2 and IR dye-1 which were dissolved in methyl isobutyl ketone, and coated onto a gelatin-subbed 178 μm thick poly(ethylene terephthalate) support and dried. The amounts of the image dyes and IR dye were selected to yield coverages as listed in Table 1 below. BLAREs 2–13 were prepared in a similar manner. BLARE 2 used the same cellulose nitrate binder, but without a gel subbing layer on the support. BLAREs 3–6 and 10–13 used a 1139 sec. cellulose nitrate binder. BLAREs 3–6 had a gel subbing layer on the support, while BLAREs 10–13 did not have any subbing layer on the support. BLARE's 7–9 used a 161 sec. cellulose nitrate binder, and were coated onto the support having a cyanoacrylamide subbing layer (Cyanamer P-21®). The compositions are summarized in Table 1 as follows:

TABLE 1

| BLARE | Cyan dyes $g/m^2$ | Magenta dye $g/m^2$ | Yellow dye $g/m^2$ | IR dye $g/m^2$ |
|---|---|---|---|---|
| 1 | D (0.30) C-1 (0.15) | II-2 (0.26) | V-1 (0.16) | IR-1 (0.18) |
| 2 | D (0.30) C-1 (0.15) | II-2 (0.26) | V-1 (0.16) | IR-1 (0.18) |
| 3 | D (0.30) C-1 (0.14) | II-2 (0.26) | V-1 (0.16) | IR-1 (0.18) |
| 4 | D (0.30) C-2 (0.01) | II-2 (0.26) | V-1 (0.16) | IR-1 (0.18) |
| 5 | D (0.30) C-1 (0.14) | VI-1 (0.50) | V-1 (0.16) | IR-1 (0.18) |
| 6 | D (0.30) C-1 (0.14) | VII-1 (0.50) | V-1 (0.16) | IR-1 (0.18) |
| 7 | D (0.30) C-1 (0.14) | II-1 (0.26) | IV-1 (0.16) | IR-1 (0.18) |
| 8 | D (0.30) C-1 (0.14) | II-2 (0.26) | IV-1 (0.16) | IR-1 (0.18) |
| 9 | D (0.67) | III-1 (0.26) | V-1 (0.16) | IR-1 (0.18) |
| 10 | D (0.67) | II-1 (0.26) | V-1 (0.16) | IR-2 (0.17) |
| 11 | C (0.67) | II-1 (0.26) | V-1 (0. 16) | IR-2 (0.17) |
| 12 | L (0.67) | II-1 (0.26) | V-1 (0.16) | IR-2 (0.17) |
| 13 | O (0.67) | II-1 (0.26) | V-1 (0.16) | IR-2 (0.17) |

TABLE 1-continued

| BLARE | Cyan dyes $g/m^2$ | Magenta dye $g/m^2$ | Yellow dye $g/m^2$ | IR dye $g/m^2$ |
|---|---|---|---|---|

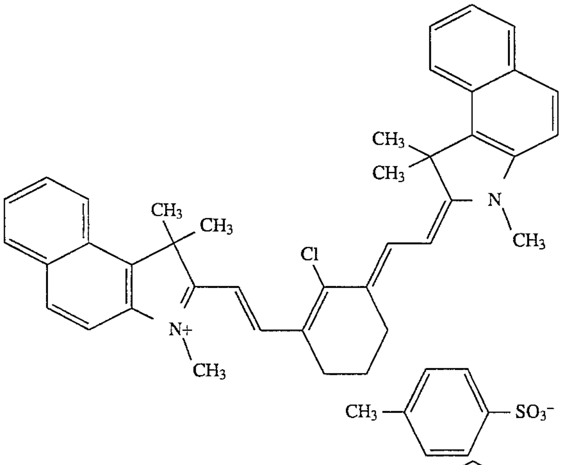

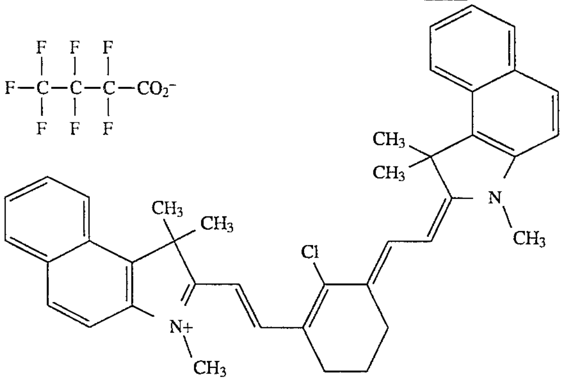

EXAMPLE 2

Preparation of Control BLARES

Control BLAREs were prepared as in Example 1 but with the exceptions noted below. The recording layer BLARE C-1 contained 1139 sec. cellulose nitrate (0.52 $g/m^2$), 0.39 $g/m^2$ each of Morfast Brown 100®, Morfast Blue 105®, and Morfast Red 104® (obtained from Morton International Inc.). and infrared absorbing dye IR-1 (0.18 $g/m^2$). This formulation is similar to Example 5 of U.S. Pat. No. 5,156,938 but adapted for writing with a diode laser emitting at 800–830 nm. BLARE C-4 is similar to C-1 except that the binder level is at 1.29 $g/m^2$. BLARE C-5 is similar to BLARE C-1 except that the binder was taken from U.S. Pat. No. 5,156,938, Table 1, Polymer VII, prepared by the methods disclosed therein, and IR-1 was 0.39 $g/m^2$.

The recording layer of BLARE C-2 contained 0.52 $g/m^2$ of 1139 cellulose nitrate, 4.8 $g/m^2$ of Electrodag 154® graphite (Acheson Colloids Co.) and 0.18 $g/m^2$ of IR dye 1. This formulation is similar to that in U.S. Pat. No. 4,245,003.

The recording layer of BLARE C-3 contained Ethocel HE® ethyl cellulose (0.16 $g/m^2$) obtained from Dow Chemical Co. and Electrodag 154® graphite (Acheson Colloids Co.) (2.1 $g/m^2$). This is similar to Example 1 of U.S. Pat. No. 4,245,003. BLARE C-6 is similar to BLARE C-3 except it was coated on unsubbed support.

The remaining controls were dye formulations as summarized in Table 2 below, and contained 0.52 $g/m^2$of 1139 sec. cellulose nitrate. C-7 was coated on a gelatin-subbed support, while C-8 and C-9 were coated on unsubbed support.

| BLARE | Cyan Dyes ($g/m^2$) | Magenta Dye ($g/m^2$) | Yellow Dye ($g/m^2$) | IR Dye ($g/m^2$) |
|---|---|---|---|---|
| C-7 | Control 1 (0.14) and Control 2 (0.01) | II-2 (0.26) | V-1 (0.16) | IR-1 (0.18) |
| C-8 | Control 1 (0.34) | II-2 (0.26) | V-1 (0.16) | IR-2 (0.17) |
| C-9 | Control 3 (0.55) | II-2 (0.26) | V-1 (0.16) | IR-2 (0.17) |

Control 1

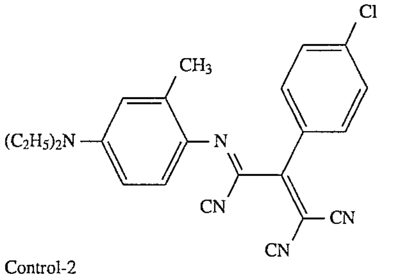

Control-2

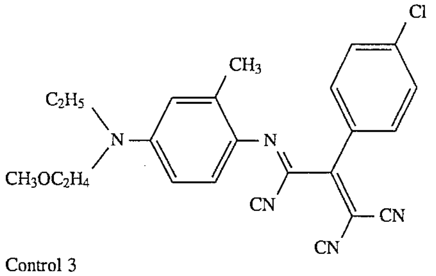

Control 3

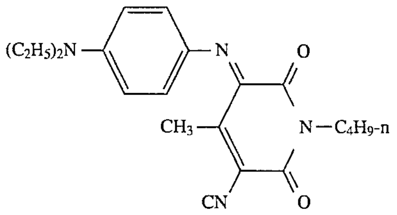

EXAMPLE 3

Selected black laser ablative recording elements described above from Table 1 and control elements listed in Example 2 were secured to the drum of a diode laser imaging device as described in U.S. Pat. No. 4,876,235 with the recording layer facing outwards. The laser imaging device consisted of a single diode laser connected to a lens assembly mounted on a translation stage and focused onto the surface of the laser ablative recording element. The diode lasers employed were Spectra Diode Labs No. SDL-2430, having an integral, attached optical fiber for the output of the laser beam with a wavelength range 800–830 nm and a nominal power output of 250 milliwatts at the end of the optical fiber. The cleaved face of the optical fiber (50 μm core diameter) was imaged onto the plane of the dye-ablative element with a 0.5 magnification lens assembly mounted on a translation stage giving a nominal spot size of 25 μm.

The drum, 53 cm in circumference, was rotated at varying speeds and the imaging electronics were activated to provide the exposure as cited in Table 3. The translation stage was incrementally advanced across the dye-ablative element by means of a lead screw turned by a microstepping motor, to give a center-to-center line distance of 10 μm (945 lines per centimeter, or 2400 lines per inch). An air stream was blown over the donor surface to remove the sublimed dye. The measured average total power at the focal plane was 90 mW. The Status A neutral densities of the dye layer before imaging were determined and were compared to the residual density after writing a D-min patch at both 100 and 150 rev./min providing 1019 and 679 mj/cm$^2$, respectively. The density values were obtained using an X-Rite densitometer Model 310 (X-Rite Co.). The following results were obtained:

TABLE 3

| BLARE | Neutral Status A D-max | Neutral Status A D-min @ 1019 mj/cm$^2$ exposure | Neutral Status A D-min @ 679 mj/cm$^2$ exposure |
|---|---|---|---|
| 1 | 3.42 | 0.20 | 0.22 |
| C-1 | 3.50 | 0.45 | 0.76 |
| C-2 | 3.21 | 0.64 | 0.79 |
| C-3 | 3.54 | 0.89 | 1.99 |

The above results show an improved D-min reduction using the compound of the invention.

EXAMPLE 4

Example 3 was repeated using different recording elements as defined in Table 4 below. The following results were obtained:

TABLE 4

| BLARE | Neutral Status A D-max | Neutral Status A D-min @ 1019 mj/cm$^2$ exposure | Neutral Status A D-min @ 679 mj/cm$^2$ exposure |
|---|---|---|---|
| 2 | 3.45 | 0.25 | 0.49 |
| C-4 | 3.04 | 0.40 | 1.45 |
| C-5 | 3.49 | 1.27 | 1.83 |
| C-6 | 3.23 | 1.05 | 1.66 |

The above results again show an improved D-min reduction using the compound of the invention.

EXAMPLE 5

Example 3 was repeated using different recording elements as defined in Table 5 below. The average power output of the laser at the focal plane was 130 mW. The drum was rotated at both 150 and 200 rev/min., yielding exposures of 981 and 736 mj/cm$^2$, respectively. The following results were obtained:

TABLE 5

| BLARE | Neutral Status A D-max | Neutral Status A D-min at 981 mj/cm$^2$ | Neutral Status A D-min at 736 mj/cm$^2$ |
|---|---|---|---|
| C-7 | 3.03 | 0.16 | 0.14 |
| 3 | 2.98 | 0.08 | 0.09 |
| 4 | 2.86 | 0.08 | 0.08 |
| 5 | 2.93 | 0.10 | 0.09 |
| 6 | 3.02 | 0.07 | 0.06 |

TABLE 5-continued

| BLARE | Neutral Status A D-max | Neutral Status A D-min at 981 mj/cm$^2$ | Neutral Status A D-min at 736 mj/cm$^2$ |
|---|---|---|---|
| 7 | 3.48 | 0.05 | 0.02 |
| 8 | 3.38 | 0.04 | 0.03 |
| 9 | 3.05 | 0.06 | 0.03 |

The above results again show an improved D-min reduction using the compounds of the invention, independent of the selection of the yellow and magenta dyes.

EXAMPLE 6

Example 3 was repeated using different recording elements as defined in Table 5 below. The average power output of the laser at the focal plane was 90 mW. The drum was rotated at both 100 and 150 rev/min., yielding exposures of 1019 and 679 mj/cm$^2$, respectively. The following results were obtained:

TABLE 6

| BLARE | Neutral Status A D-max | Neutral Status A D-min @ 1019 mj/cm$^2$ exposure | Neutral Status A D-min @ 679 mj/cm$^2$ exposure |
|---|---|---|---|
| 10 | 3.05 | 0.20 | 0.18 |
| 11 | 2.94 | 0.16 | 0.18 |
| 12 | 3.07 | 0.19 | 0.18 |
| 13 | 3.06 | 0.17 | 0.17 |
| C-8 | 3.14 | 0.56 | 0.56 |
| C-9 | 3.07 | 0.32 | 0.34 |

The above results again show an improved D-min reduction using the compounds of the invention, independent of the selection of the IR dye.

The invention has been described in detail with particular reference to preferred embodiments thereof, but it will be understood that variations and modifications can be effected within the spirit and scope of the invention.

What is claimed is:

1. A single sheet process of forming a black, dye ablation image having an improved D-min which does not employ a separate receiving element comprising imagewise-heating by means of a laser, a dye-ablative recording element comprising a support having thereon a dye layer comprising image dyes dispersed in a polymeric binder having an infrared-absorbing material associated therewith, said laser exposure taking place through the dye side of said element, and removing the ablated image dye material to obtain said image in said dye-ablative recording element, wherein said dye layer comprises a mixture of at least one cyan, magenta and yellow dye dispersed in a polymeric binder, said cyan dye having the formula:

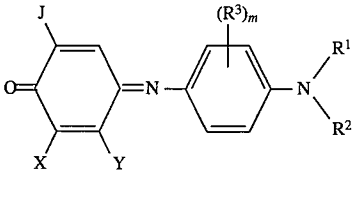

I wherein:

$R^1$ and $R^2$ each independently represents hydrogen; an alkyl group having from 1 to about 6 carbon atoms; a cycloalkyl group having from about 5 to about 7 carbon atoms or an allyl group;

or $R^1$ and $R^2$ can be joined together to form, along with the nitrogen to which they are attached, a 5- to 7-membered heterocyclic ring;

or either or both of $R^1$ and $R^2$ can be combined with $R^3$ to form a 5- to 7-membered heterocyclic ring;

each $R^3$ independently represents hydrogen, alkyl, cycloalkyl or allyl as described above for $R^1$ and $R^2$, alkoxy, aryloxy, halogen, thiocyano, acylamido, ureido, alkylsulfonamido, arylsulfonamido, alkylthio, arylthio or trifluoromethyl;

or any two of $R^3$ may be combined together to form a 5- or 6-membered carbocyclic or heterocyclic ring;

or one or two of $R^3$ may be combined with either or both of $R^1$ and $R^2$ to complete a 5 - to 7-membered ring;

X represents hydrogen, halogen or may be combined together with Y to represent the atoms necessary to complete a 6-membered aromatic ring; with the proviso that when X is hydrogen, then J represents $NHCOR_F$, where $R_F$ represents a perfluorinated alkyl or aryl group; and with the further proviso that when X is halogen, then J represents $NHCOR^4$, $NHCO_2R^4$, $NHCONHR^4$ or $NHSO_2R^4$; and with the further proviso that when X is combined with Y, then J represents $CONHR^4$, $SO_2NHR^4$, CN, $SO_2R^4$ or SCN, in which case, however, $R^4$ cannot be hydrogen;

$R^4$ is the same as $R^1$ as described above or an aryl group of from about 6 to about 10 carbon atoms;

m is an integer of from 0 to 4; and

Y is the same as $R^1$ as described above, an aryl group of from about 6 to about 10 carbon atoms, acylamino or may be combined together with X as described above.

2. The process of claim 1 wherein said magenta dye has the formula:

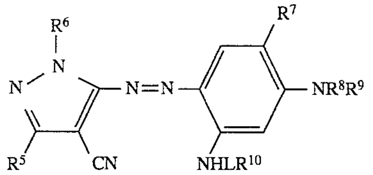

II wherein:

$R^5$ is hydrogen, an alkyl group of from 1 to about 6 carbon atoms, or an aryl group of from about 6 to about 10 carbon atoms;

$R^6$ is an alkyl or allyl group of from 1 to about 6 carbon atoms, or an aryl group of from about 6 to about 10 carbon atoms;

$R^7$ is an alkoxy group of from 1 to about 4 carbon atoms or represents the atoms which when taken together with $R^9$ forms a 5- or 6-membered ring;

$R^8$ is an alkyl or allyl group of from 1 to about 6 carbon atoms;

$R^9$ is any of the groups for $R^8$ or represents the atoms which when taken together with $R^7$ forms a 5- or 6-membered ring;

$R^{10}$ is an alkyl group of from 1 to about 6 carbon atoms, or an aryl group of from about 6 to about 10 carbon atoms; and L is CO, $CO_2$, $-SO_2-$ or $CONR^5-$.

3. The process of claim 1 wherein said magenta dye has the formula:

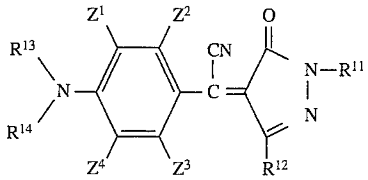

III wherein:

$R^{11}$ represents an alkyl group having from 1 to 10 carbon atoms; a cycloalkyl group having from 5 to 7 carbon atoms or an aryl or pyridinyl group having from 6 to 10 carbon atoms;

$R^{12}$ represents an alkoxy group having from 1 to 10 carbon atoms; an aryloxy group having from 6 to 10 carbon atoms; $NHR^{15}$; or $NR^{15}R^{16}$;

$R^{13}$ and $R^{14}$ each represents $R^{11}$; or $R^{13}$ can be joined to $Z^1$ to form a 5- or 6-membered ring and/or $R^{14}$ can be joined to $Z^4$ to form a 5- or 6-membered ring; or $R^{13}$ and $R^{14}$ can be joined together to form, along with the nitrogen to which they are attached, a 5- or 6-membered heterocyclic ring;

$R^{15}$ and $R^{16}$ each independently represents an alkyl group having from 1 to 10 carbon atoms; a cycloalkyl group having from 5 to 7 carbon atoms or an aryl group having from 6 to 10 carbon atoms; or $R^{15}$ and $R^{16}$ may be joined together to form, along with the nitrogen to which they are attached, a 5- or 6-membered heterocyclic ring; and $Z^1$, $Z^2$, $Z^3$ and $Z^4$ each represents hydrogen, an alkyl group, an alkoxy group or halogen; or $Z^1$ and $Z^2$ can be joined together to form, along with the carbon atoms to which they are attached, a 5- or 6-membered ring.

4. The process of claim 1 wherein said yellow dye has the formula:

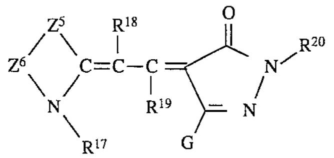

IV wherein:

$R^{17}$ represents an alkyl group of from 1 to about 10 carbon atoms, a cycloalkyl group of from about 5 to about 7 carbon atoms; an allyl group; an aryl group of from about 6 to about 10 carbon atoms; a hetaryl group of from 5 to 10 atoms; acyl; arylsulfonyl; aminocarbonyl; aminosulfonyl; fluorosulfonyl; halogen; nitro; alkylthio; or arylthio;

$R^{18}$ and $R^{19}$ each independently represents hydrogen, $R^{17}$; cyano; acyloxy; alkoxy of 1 to about 6 carbon atoms; halogen; or alkoxycarbonyl;

or any two of $R^{17}$, $R^{18}$ and $R^{19}$ together represent the atoms necessary to complete a 5- to 7-membered ring;

$R^{20}$ represents the same groups as $R^{17}$;

G represents an alkyl, cycloalkyl or allyl group as described above for $R^{17}$, $NR^{21}R^{22}$ or $OR^{23}$;

$R^{21}$ and $R^{22}$ each independently represents hydrogen, acyl or $R^{17}$, with the proviso that $R^{21}$ and $R^{22}$ cannot both be hydrogen at the same time;

or $R^{21}$ and $R^{22}$ together represent the atoms necessary to complete a 5- to 7-membered ring;

$R^{23}$ represents the same groups as $R^{17}$; $Z^5$ represents $C(R^{24})(R^{25})$, S, O or $NR^{24}$; $R^{24}$ and $R^{25}$ each independently represents the same groups as $R^{17}$;

or $R^{24}$ and $R^{25}$ together represent the atoms necessary to complete a 5- to 7-membered ring; and $Z^6$ represents the atoms necessary to complete a 5- or 6-membered ring which may be fused to another ring system.

5. The process of claim 1 wherein said yellow dye has the formula:

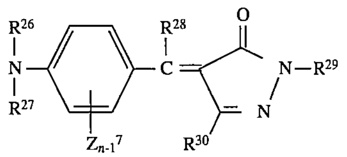

V wherein:

$R^{26}$ and $R^{27}$ each represents any of the groups for $R^{29}$; or $R^{26}$ and $R^{27}$ can be joined together to form, along with the nitrogen to which they are attached, a 5-or 6-membered heterocyclic ring; or either or both of $R^{26}$ and $R^{27}$ can be joined to the carbon atom of the benzene ring at a position ortho to the position of attachment of the anilino nitrogen to form a 5- or 6-membered ring, thus forming a polycyclic system;

$R^{28}$ represents hydrogen; an alkyl group of from 1 to about 10 carbon atoms; a cycloalkyl group of from about 5 to about 7 carbon atoms; an allyl group; carbamoyl; or alkoxycarbonyl;

$R^{29}$ represents an alkyl group of from 1 to about 10 carbon atoms; a cycloalkyl group of from about 5 to about 7 carbon atoms; an allyl group; or an aryl group having from about 6 to about 10 carbon atoms;

$R^{30}$ represents an alkoxy group having from 1 to about 10 carbon atoms; an aryloxy group having from about 6 to about 10 carbon atoms; $NHR^{31}$; $NR^{31}R^{32}$ or the atoms necessary to complete a 6-membered ring fused to the benzene ring;

$R^{31}$ and $R^{32}$ each independently represents any of the groups for $R^{29}$; or $R^{31}$ and $R^{32}$ may be joined together to form, along with the nitrogen to which they are attached, a 5-or 6-membered heterocyclic ring;

n is a positive integer from 1 to 3; and $Z^7$ represents an alkyl or alkoxy group of from 1 to about 10 carbon atoms; halogen; aryloxy; or represents the atoms necessary to complete a 5- or 6-membered ring, thus forming a fused ring system.

6. The process of claim 1 wherein said magenta dye has the formula:

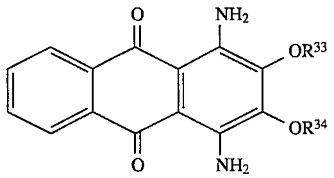

VI wherein $R^{33}$ and $R^{34}$ are each individually aryl of from about 6 to about 10 carbon atoms.

7. The process of claim 1 wherein said magenta dye has the formula:

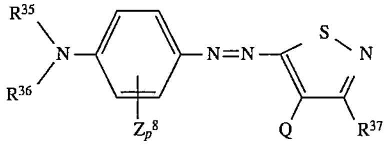

VII wherein:

$R^{35}$ and $R^{36}$ each independently represents hydrogen; an alkyl group of from 1 to about 10 carbon atoms; a cycloalkyl group of from about 5 to about 7 carbon atoms; an allyl group; or an aryl group having from about 6 to about 10 carbon atoms;

or $R^{35}$ and $R^{36}$ can be joined together to form, along with the nitrogen to which they are attached, a 5- or 6-membered heterocyclic ring;

or either or both of $R^{35}$ and $R^{36}$ can be joined to the carbon atom of the benzene ring at a position ortho to the position of attachment of the anilino nitrogen to form a 5- or 6-membered ring, thus forming a polycyclic system;

$Z^8$ represents hydrogen, an alkyl group of from 1 to about 10 carbon atoms; an aryl group of from about 6 to about 10 carbon atoms; or NHA, where A is an acyl or sulfonyl radical;

Q represents cyano, thiocyanato, alkylthio or alkoxycarbonyl;

$R^{37}$ represents hydrogen; an alkyl group of from 1 to about 10 carbon atoms; an aryl group of from about 6 to about 10 carbon atoms; alkylthio or halogen; and p is a positive integer from 1 to 4.

* * * * *